United States Patent
Fassnacht et al.

(10) Patent No.: US 9,983,267 B2
(45) Date of Patent: May 29, 2018

(54) LOW-VOLTAGE NETWORK WITH A DC-DC CONVERTER AND METHOD FOR TESTING A LOW-VOLTAGE BATTERY BY EMPLOYING PULSES FEED TO THE LOW-VOLTAGE BATTERY TO SENSE EITHER VOLTAGE OR CURRENT RESPONSE

(71) Applicant: Robert Bosch GmbH, Stuttgart (DE)

(72) Inventors: Jochen Fassnacht, Calw (DE); Clemens Schmucker, Tamm (DE)

(73) Assignee: Robert Bosch GmbH, Stuttgart (DE)

( * ) Notice: Subject to any disclaimer, the term of this patent is extended or adjusted under 35 U.S.C. 154(b) by 290 days.

(21) Appl. No.: 14/425,484

(22) PCT Filed: Jul. 5, 2013

(86) PCT No.: PCT/EP2013/064236
§ 371 (c)(1),
(2) Date: Mar. 3, 2015

(87) PCT Pub. No.: WO2014/037133
PCT Pub. Date: Mar. 13, 2014

(65) Prior Publication Data
US 2015/0219725 A1 Aug. 6, 2015

(30) Foreign Application Priority Data
Sep. 5, 2012 (DE) .......................... 10 2012 215 755

(51) Int. Cl.
*G01R 29/02* (2006.01)
*G01R 31/36* (2006.01)

(52) U.S. Cl.
CPC ......... *G01R 31/3627* (2013.01); *G01R 29/02* (2013.01); *G01R 31/36* (2013.01)

(58) Field of Classification Search
CPC ..... G01R 31/3627; G01R 29/02; G01R 31/36
(Continued)

(56) References Cited

U.S. PATENT DOCUMENTS 3,668,522 A * 6/1972 Ghafghaichi .......... G01R 29/02
324/617
4,246,529 A * 1/1981 Jurgens ................. H02J 7/0078
320/139
(Continued)

FOREIGN PATENT DOCUMENTS

CN 1140352 1/1997
CN 1707280 12/2005
(Continued)

OTHER PUBLICATIONS

International Search Report for Application No. PCT/EP2013/064236 dated Oct. 2, 2013 (English Translation, 3 pages).

*Primary Examiner* — Robert Grant
*Assistant Examiner* — John Trischler
(74) *Attorney, Agent, or Firm* — Michael Best & Friedrich LLP

(57) ABSTRACT

The invention relates to a DC-DC converter which is designed to supply a low-voltage network comprising a low-voltage battery and a battery sensor circuit with a low voltage, having a pulse generation device which is designed to feed electrical pulses into the low-voltage network in order to test the low-voltage battery using the battery sensor circuit.

14 Claims, 2 Drawing Sheets

(58) Field of Classification Search
USPC .......................................................... 324/426
See application file for complete search history.

(56) References Cited

U.S. PATENT DOCUMENTS

| | | | | |
|---|---|---|---|---|
| 4,314,193 | A * | 2/1982 | Mortonson | G01R 31/343 320/123 |
| 4,575,679 | A * | 3/1986 | Chung | G01R 19/16542 307/39 |
| 4,736,150 | A * | 4/1988 | Wagner | H02J 7/0093 320/129 |
| 5,245,524 | A * | 9/1993 | Nakagawa | H02M 3/07 320/166 |
| 5,250,891 | A * | 10/1993 | Glasgow | H02J 7/022 320/140 |
| 5,250,903 | A * | 10/1993 | Limuti | H01M 10/484 324/204 |
| 5,568,052 | A * | 10/1996 | Sway-Tin | B60L 11/1851 320/DIG. 21 |
| 5,587,916 | A * | 12/1996 | Martinson | G01R 19/16542 323/224 |
| 5,594,308 | A * | 1/1997 | Nuckolls | H05B 41/042 315/205 |
| 5,642,031 | A * | 6/1997 | Brotto | H02J 7/0081 320/156 |
| 5,648,714 | A * | 7/1997 | Eryou | H02J 7/0093 320/139 |
| 5,712,779 | A * | 1/1998 | Sheppard | H04M 19/00 361/614 |
| 5,821,756 | A * | 10/1998 | McShane | G01R 31/3662 324/427 |
| 5,869,970 | A * | 2/1999 | Palm | A61N 1/3708 324/433 |
| 5,872,443 | A * | 2/1999 | Williamson | H01M 10/44 320/160 |
| 6,094,034 | A * | 7/2000 | Matsuura | H02J 7/0093 320/134 |
| 6,154,011 | A * | 11/2000 | Lam | B60L 3/0046 320/139 |
| 6,167,309 | A * | 12/2000 | Lyden | A61N 1/3708 607/29 |
| 6,169,389 | B1 * | 1/2001 | Chen | H02J 7/345 320/166 |
| 6,262,563 | B1 * | 7/2001 | Champlin | G01R 31/3662 320/134 |
| 6,310,481 | B2 * | 10/2001 | Bertness | G01R 31/36 320/161 |
| 6,392,414 | B2 * | 5/2002 | Bertness | G01R 31/36 324/429 |
| 6,404,163 | B1 * | 6/2002 | Kapsokavathis | H02J 7/0029 320/104 |
| 6,426,628 | B1 * | 7/2002 | Palm | A61N 1/3708 324/427 |
| 6,608,900 | B1 * | 8/2003 | Yancey | H04M 19/001 307/39 |
| 6,618,681 | B2 * | 9/2003 | Hoenig | G01R 31/362 307/18 |
| 6,631,293 | B2 * | 10/2003 | Lyden | A61N 1/3708 607/29 |
| 6,639,384 | B2 * | 10/2003 | Hasegawa | H02J 7/1423 320/126 |
| 6,654,640 | B2 * | 11/2003 | Lyden | A61N 1/3708 607/29 |
| 6,778,078 | B1 * | 8/2004 | Han | G08B 3/10 340/384.4 |
| 6,781,382 | B2 * | 8/2004 | Johnson | G01R 31/3668 320/132 |
| 6,928,148 | B2 * | 8/2005 | Simon | G08B 25/008 379/39 |
| 6,990,422 | B2 * | 1/2006 | Laletin | G01N 27/4161 320/116 |
| 7,078,965 | B2 * | 7/2006 | Laletin | H03F 1/34 330/124 R |
| 7,298,113 | B2 * | 11/2007 | Orikasa | H01M 6/5033 320/103 |
| 7,421,323 | B2 * | 9/2008 | Dannenberg | F02D 31/001 307/130 |
| 7,463,139 | B2 * | 12/2008 | Burlak | B60D 1/62 280/423.1 |
| 7,558,379 | B2 * | 7/2009 | Winick | G08B 25/008 379/37 |
| 7,579,811 | B2 * | 8/2009 | Sato | H01M 10/4264 320/132 |
| 7,586,290 | B2 * | 9/2009 | Hirata | G01R 31/3606 180/65.31 |
| 7,595,675 | B2 * | 9/2009 | Boerstler | G01R 31/31727 320/166 |
| 7,622,894 | B2 * | 11/2009 | Kawahara | G01R 31/3624 320/127 |
| 7,622,929 | B2 * | 11/2009 | Tinnemeyer | G01R 31/3631 320/129 |
| 7,791,312 | B2 * | 9/2010 | Kook | H02J 7/0044 320/108 |
| 7,839,116 | B2 * | 11/2010 | Esaka | B60K 6/28 123/179.3 |
| 7,872,362 | B2 * | 1/2011 | Kato | H02J 7/1446 123/179.3 |
| 7,904,260 | B2 * | 3/2011 | Burlak | H02H 3/12 307/52 |
| 7,908,101 | B2 * | 3/2011 | Burlak | H02H 3/12 318/599 |
| 7,932,623 | B2 * | 4/2011 | Burlak | B60D 1/62 307/9.1 |
| 7,936,147 | B2 * | 5/2011 | Kook | H02J 7/0044 320/108 |
| 7,990,108 | B2 * | 8/2011 | Aas | H02J 7/0031 320/112 |
| 8,054,043 | B2 * | 11/2011 | Yano | B60L 11/1861 320/118 |
| 8,054,045 | B2 * | 11/2011 | Kawahara | G01R 31/3624 320/127 |
| 8,072,187 | B2 * | 12/2011 | Wu | H02J 7/0008 307/46 |
| 8,096,482 | B2 * | 1/2012 | Dage | B60H 1/00657 123/179.2 |
| 8,134,339 | B2 * | 3/2012 | Burlak | H02H 3/12 307/10.1 |
| 8,134,342 | B2 * | 3/2012 | Labrunie | H01M 10/4264 320/141 |
| 8,198,865 | B2 * | 6/2012 | Mirowski | H02H 3/12 307/10.1 |
| 8,242,748 | B2 * | 8/2012 | Burlak | H02H 3/12 307/10.1 |
| 8,242,928 | B2 * | 8/2012 | Prammer | E21B 17/003 340/853.7 |
| 8,244,422 | B2 * | 8/2012 | Fujitake | B60L 11/14 180/65.29 |
| 8,362,745 | B2 * | 1/2013 | Tinaphong | H02J 17/00 320/101 |
| 8,368,357 | B2 * | 2/2013 | Ghantous | G01R 31/3637 320/134 |
| 8,427,112 | B2 * | 4/2013 | Ghantous | G01R 31/3637 320/137 |
| 8,513,921 | B2 * | 8/2013 | Berkowitz | G01R 31/3637 320/141 |
| 8,519,676 | B2 * | 8/2013 | Li | H02J 7/022 320/137 |
| 8,583,389 | B2 * | 11/2013 | Aoshima | B60L 3/0046 702/63 |
| 8,610,404 | B2 * | 12/2013 | Reefman | H01M 10/0436 320/117 |
| 8,638,067 | B2 * | 1/2014 | Sato | H02J 7/00 320/134 |
| 8,638,070 | B2 * | 1/2014 | Maluf | H02J 7/0052 320/141 |
| 8,704,677 | B2 * | 4/2014 | Prammer | E21B 17/003 340/853.7 |
| 8,729,864 | B2 * | 5/2014 | Dittmer | B60L 3/0007 320/128 |

(56) References Cited

U.S. PATENT DOCUMENTS

| | | | | |
|---|---|---|---|---|
| 8,791,669 B2* | 7/2014 | Ghantous | G01R 31/3637 | 320/139 |
| 8,816,530 B2* | 8/2014 | Callicoat | B60L 1/00 | 307/10.1 |
| 8,880,178 B2* | 11/2014 | Popovic | A61N 1/36003 | 607/148 |
| 8,900,325 B2* | 12/2014 | Herr | A61F 2/60 | 601/5 |
| 8,937,822 B2* | 1/2015 | Dent | H02M 1/32 | 363/131 |
| 8,970,178 B2* | 3/2015 | Berkowitz | B60L 11/1861 | 320/129 |
| 8,975,874 B2* | 3/2015 | Berkowitz | H02J 7/0052 | 320/141 |
| 9,007,068 B2* | 4/2015 | Pushkolli | G01R 31/007 | 318/490 |
| 9,035,621 B2* | 5/2015 | Berkowitz | G01R 31/3637 | 320/134 |
| 9,048,689 B2* | 6/2015 | Bosson | H02J 3/14 | 320/116 |
| 9,121,910 B2* | 9/2015 | Maluf | G01R 31/3637 | |
| 9,373,972 B2* | 6/2016 | Ghantous | H02J 7/0052 | |
| 9,385,555 B2* | 7/2016 | Ghantous | H02J 7/0052 | |
| 9,440,077 B2* | 9/2016 | Popovic | A61N 1/36003 | |
| 9,531,200 B2* | 12/2016 | Naddei | H02J 7/0075 | |
| 9,533,164 B2* | 1/2017 | Erickson | A61N 1/378 | |
| 9,543,778 B1* | 1/2017 | Corti | H02J 7/025 | |
| 9,735,703 B2* | 8/2017 | Dent | H02M 1/32 | |
| 9,789,771 B2* | 10/2017 | Steele | B60L 11/18 | |
| 2001/0050976 A1* | 12/2001 | Simon | G08B 25/008 | 379/39 |
| 2002/0140397 A1* | 10/2002 | Hasegawa | H02J 7/1423 | 320/104 |
| 2003/0184264 A1* | 10/2003 | Bertness | H02J 7/0054 | 320/137 |
| 2003/0206021 A1* | 11/2003 | Laletin | G01R 31/3631 | 324/426 |
| 2004/0128088 A1* | 7/2004 | Laletin | G01N 27/4161 | 702/64 |
| 2004/0201362 A1* | 10/2004 | Borrego Bel | H02J 7/1423 | 320/104 |
| 2005/0127871 A1* | 6/2005 | Orikasa | H01M 6/5033 | 320/112 |
| 2005/0151513 A1* | 7/2005 | Cook | H02J 7/1423 | 320/137 |
| 2005/0213715 A1* | 9/2005 | Winick | G08B 25/008 | 379/39 |
| 2005/0237109 A1* | 10/2005 | Laletin | H03F 1/34 | 330/84 |
| 2005/0280396 A1 | 12/2005 | Hirata et al. | | |
| 2006/0085099 A1* | 4/2006 | Burlak | B60D 1/62 | 701/1 |
| 2006/0253237 A1* | 11/2006 | Dannenberg | F02D 31/001 | 701/36 |
| 2008/0024137 A1* | 1/2008 | Carlin | G01R 31/3631 | 324/427 |
| 2008/0100346 A1* | 5/2008 | Kim | H03K 9/08 | 327/37 |
| 2008/0103707 A1* | 5/2008 | Iwasaki | H02J 7/0021 | 702/58 |
| 2008/0203975 A1* | 8/2008 | Burlak | H02H 3/12 | 320/161 |
| 2008/0204033 A1* | 8/2008 | Burlak | H02H 3/12 | 324/504 |
| 2008/0208491 A1* | 8/2008 | Burlak | H02H 3/12 | 702/58 |
| 2009/0015193 A1* | 1/2009 | Esaka | B60K 6/28 | 320/103 |
| 2009/0048643 A1* | 2/2009 | Erickson | A61N 1/378 | 607/59 |
| 2009/0261778 A1* | 10/2009 | Kook | H02J 7/0044 | 320/108 |
| 2009/0265121 A1* | 10/2009 | Rocci | G01R 31/362 | 702/57 |
| 2010/0029097 A1* | 2/2010 | Burlak | B60D 1/62 | 439/35 |
| 2010/0030499 A1* | 2/2010 | Kawahara | G01R 31/3624 | 702/63 |
| 2010/0066309 A1* | 3/2010 | Labrunie | H01M 10/4264 | 320/141 |
| 2010/0072290 A1* | 3/2010 | Dage | B60H 1/00657 | 236/51 |
| 2010/0123428 A1* | 5/2010 | Wu | H02J 7/0008 | 320/102 |
| 2010/0185405 A1* | 7/2010 | Aoshima | B60L 3/0046 | 702/63 |
| 2010/0213897 A1* | 8/2010 | Tse | H02J 7/0013 | 320/116 |
| 2010/0225278 A1* | 9/2010 | Reefman | H01M 10/0436 | 320/135 |
| 2010/0244782 A1* | 9/2010 | Nagayama | B60L 11/1868 | 320/162 |
| 2010/0289450 A1* | 11/2010 | Kook | H02J 7/0044 | 320/108 |
| 2010/0295514 A1* | 11/2010 | Burlak | H02H 3/12 | 320/160 |
| 2010/0297883 A1* | 11/2010 | Burlak | H02H 3/12 | 439/620.21 |
| 2011/0006726 A1* | 1/2011 | Dittmer | B60L 3/0007 | 320/101 |
| 2011/0133920 A1* | 6/2011 | Meadors | B60W 10/06 | 340/439 |
| 2011/0254514 A1* | 10/2011 | Fleming | H02M 3/158 | 320/166 |
| 2011/0298624 A1* | 12/2011 | Bauman | H02J 7/14 | 340/636.1 |
| 2011/0316548 A1* | 12/2011 | Ghantous | G01R 31/3637 | 324/427 |
| 2012/0013189 A1* | 1/2012 | Jenkins | H02J 1/14 | 307/80 |
| 2012/0020060 A1* | 1/2012 | Myer | F21S 2/00 | 362/183 |
| 2012/0022817 A1* | 1/2012 | Rocci | G01R 31/362 | 702/63 |
| 2012/0032648 A1* | 2/2012 | Ghantous | G01R 31/3637 | 320/139 |
| 2012/0203483 A1* | 8/2012 | Ghantous | G01R 31/3637 | 702/63 |
| 2012/0229101 A1* | 9/2012 | Fertman | H02J 7/0024 | 320/167 |
| 2012/0281444 A1* | 11/2012 | Dent | H02M 1/32 | 363/56.01 |
| 2012/0306264 A1* | 12/2012 | Komma | B60R 25/00 | 307/9.1 |
| 2013/0063093 A1* | 3/2013 | Sato | H02J 7/00 | 320/134 |
| 2013/0080095 A1* | 3/2013 | Rocci | G01R 31/362 | 702/63 |
| 2013/0082521 A1* | 4/2013 | Callicoat | B60L 1/00 | 307/10.1 |
| 2013/0090712 A1* | 4/2013 | Popovic | A61N 1/36003 | 607/148 |
| 2013/0154548 A1* | 6/2013 | Berkowitz | G01R 31/3637 | 320/107 |
| 2013/0158750 A1* | 6/2013 | Bosson | H02J 3/14 | 701/3 |
| 2014/0021959 A1* | 1/2014 | Maluf | G01R 31/3637 | 324/430 |
| 2014/0049215 A1* | 2/2014 | Fassnacht | B60L 11/1814 | 320/109 |
| 2014/0084687 A1* | 3/2014 | Dent | H02M 1/32 | 307/26 |
| 2014/0132215 A1* | 5/2014 | Griessbach | B60L 3/0046 | 320/109 |
| 2014/0312912 A1* | 10/2014 | Berkowitz | G01R 31/3637 | 324/426 |
| 2014/0327388 A1* | 11/2014 | Naddei | H02J 7/0075 | 320/107 |

(56) References Cited

U.S. PATENT DOCUMENTS

| | | | | |
|---|---|---|---|---|
| 2014/0361781 A1* | 12/2014 | Levine | .............. | H01L 27/14632 324/425 |
| 2015/0008929 A1* | 1/2015 | Ehrmann | .............. | B60L 3/0046 324/426 |
| 2015/0021990 A1* | 1/2015 | Myer | ........................ | F21S 2/00 307/23 |
| 2015/0039051 A1* | 2/2015 | Popovic | .............. | A61N 1/36003 607/48 |
| 2015/0219722 A1* | 8/2015 | Maluf | ................. | G01R 31/3637 324/426 |
| 2015/0258948 A1* | 9/2015 | Planas | ................. | F02N 11/0818 307/10.6 |
| 2015/0288225 A1* | 10/2015 | Dent | ........................ | H02M 1/32 307/66 |
| 2015/0295413 A1* | 10/2015 | Dent | ........................ | H02M 1/32 307/77 |
| 2015/0318796 A1* | 11/2015 | Dent | ........................ | H02M 1/32 363/97 |
| 2016/0072333 A1* | 3/2016 | Fertman | ................ | H02J 7/0024 320/167 |
| 2016/0197382 A1* | 7/2016 | Sood | .................. | G01R 31/3679 429/92 |
| 2016/0311326 A1* | 10/2016 | Steele | ..................... | B60L 11/18 |
| 2016/0365731 A9* | 12/2016 | Dent | ........................ | H02M 1/32 |
| 2016/0372970 A9* | 12/2016 | Dent | ........................ | H02M 1/32 |
| 2017/0070162 A9* | 3/2017 | Dent | ........................ | H02M 1/32 |
| 2017/0077704 A1* | 3/2017 | Faley | ........................ | H02J 3/14 |
| 2017/0144553 A1* | 5/2017 | Steele | ..................... | B60L 11/18 |

FOREIGN PATENT DOCUMENTS

| | | |
|---|---|---|
| CN | 101160688 | 4/2008 |
| DE | 10219824 | 11/2003 |
| DE | 102004035470 | 2/2005 |
| DE | 102010063054 | 6/2012 |
| EP | 2073028 | 6/2009 |
| JP | 03124201 A * | 5/1991 |
| WO | 2013079636 | 6/2013 |

* cited by examiner

LOW-VOLTAGE NETWORK WITH A DC-DC CONVERTER AND METHOD FOR TESTING A LOW-VOLTAGE BATTERY BY EMPLOYING PULSES FEED TO THE LOW-VOLTAGE BATTERY TO SENSE EITHER VOLTAGE OR CURRENT RESPONSE

BACKGROUND OF THE INVENTION

The invention relates to a DC-DC converter for testing a low-voltage battery, to an electrical drive system comprising a low-voltage network and a DC-DC converter, and to a method for testing a low-voltage battery, in particular in electrically operated vehicles such as electric cars and hybrid vehicles.

It is to be expected that future electronic systems which combine new energy storage technologies with electric drive technology will be used increasingly both in stationary applications, as such as, for example, wind turbines or solar systems, and in vehicles, such as hybrid or electric vehicles.

In low-voltage electrical distribution systems in electrical drive systems of electrically operated vehicles, electrical distribution system consumers such as, for example, brake assist or steering assist functions are supplied power firstly by a low-voltage battery and secondly by a further energy source. The further energy source in conventional vehicles is generally the alternator, while in electrically operated vehicles such as electric vehicles or hybrid vehicles, a DC-DC converter, as further energy source, draws electrical energy from the high-voltage network of the vehicle and feeds it into the low-voltage network. Generally, the low-voltage battery, for example a 12 volt battery, is used as backup and/or for buffer-storing in the case of peak loads, while the main or basic load for the electrical distribution system consumers is borne by the further energy source.

If the low-voltage battery should fail owing to a malfunction or a defect during operation of the electrical drive system, the buffer effect of the low-voltage battery in the case of peak loads is lost. It is therefore necessary to modify the energy management in the low-voltage network in order to stabilize the low-voltage network.

This requires reliable, rapid and safe identification of the failure of the low-voltage battery in order to be able to introduce the stabilizing countermeasures as quickly as possible. The publication EP 2 073 028 A1, for example, discloses a sensor arrangement for a battery, with the aid of which the operating state of the battery can be detected and can be passed on to an energy management system in an electrically operated vehicle. The publication DE 102 19 824 A1 discloses a method for identifying battery-less operation of a vehicle electrical distribution system comprising a generator driven by a motor, a battery, low-voltage consumers and means for voltage evaluation.

There is a need for solutions which enable diagnosis of the low-voltage battery in a low-voltage network of an electrical drive system in a reliable and rapid manner.

SUMMARY OF THE INVENTION

The present invention in accordance with one aspect provides a DC-DC converter, which is configured to supply a low voltage to a low-voltage network comprising a low-voltage battery and a battery sensor circuit, comprising a pulse generation device, which is configured to feed electrical pulses for testing the low-voltage battery through the battery sensor circuit into the low-voltage network.

In accordance with a further aspect, the present invention provides a low-voltage network, in particular in an electrical drive system for an electrically operated vehicle, comprising a DC-DC converter in accordance with the invention a low-voltage battery, and a battery sensor circuit, which is configured to detect operational parameters of the low-voltage battery depending on the electrical pulses generated by the DC-DC converter.

In accordance with a further aspect, the present invention provides a method for testing a low-voltage battery, comprising the steps of generating electrical pulses by means of a DC-DC converter, which is configured to supply a low voltage to a low-voltage network comprising a low-voltage battery and a battery sensor circuit, feeding the electrical pulses into the low-voltage network, and detecting operational parameters of the low-voltage battery by means of the battery sensor circuit depending on the electrical pulses.

One concept of the present invention consists in using a DC-DC converter, which couples a high-voltage network of an electrical drive or generator system to a low-voltage network and supplies electrical energy to the low-voltage network from the high-voltage network, for testing the operating state of a low-voltage battery of the low-voltage network. For this purpose, the DC-DC converter generates one or more characteristically shaped voltage, current or power pulses, which are fed into the low-voltage network and in the process in particular into the low-voltage battery. A battery sensor connected to the low-voltage battery can use these characteristic test pulses to perform a diagnosis of the operating state of the low-voltage battery and in the process to identify in particular malfunctions or defects of the low-voltage battery.

One advantage of the invention consists in that faults or defects in the low-voltage battery which occur or can be detected only when the low-voltage battery is subjected to a load can also be identified. By virtue of the generation of characteristic test pulses by the DC-DC converter, it is therefore possible to implement targeted, short-term, dynamic excitation of the low-voltage battery, which enables precise determination of critical battery parameters, such as the internal resistance, for example.

It is particularly advantageous that no further components need to be introduced into the electrical drive system or generator system. An already existing battery sensor and the DC-DC converter therefore only need to be matched to one another in terms of their operating mode. This reduces the implementation costs, the amount of physical space required and the system weight of the drive system or generator system.

In addition, it is advantageous that the test pulses can be generated as required, as a result of which malfunctions or defects of the low-voltage battery can be identified independently of a fluctuating energy demand of the low-voltage consumers. As a result, the reliability and therefore the availability of the low-voltage network are increased.

In accordance with one embodiment of the DC-DC converter according to the invention, the pulse generation device can be configured to feed a multiplicity of electrical pulses in a predetermined sequence into the low-voltage network. As a result, disruptive effects as a result of random fluctuations in the power consumption in the low-voltage network can be compensated for using statistical means.

In accordance with a further embodiment of the DC-DC converter according to the invention, the pulse generation device can be configured to generate the electrical pulses as current pulses, voltage pulses or power pulses.

In accordance with a further embodiment of the DC-DC converter according to the invention, the pulse generation device can be configured to transmit parameters relating to electrical pulses to a grid management device via a communications interface. As a result, a correlation or synchronization of the pulse generation with the detection of the operational parameters of the low-voltage battery can advantageously take place.

In accordance with one embodiment of the low-voltage network according to the invention, the low-voltage network can furthermore have a grid management device, which is coupled to the DC-DC converter and the battery sensor circuit, and which is configured to synchronize the generation of the electrical pulses by the DC-DC converter with the detection of the operational parameters of the low-voltage battery by the battery sensor circuit.

In accordance with a further embodiment of the low-voltage network according to the invention, the battery sensor circuit can have a detection device, a current sensor and a voltage sensor, and the detection device can be configured to detect the current from the low-voltage battery or into the low-voltage battery via the current sensor and to detect the voltage drop across the low-voltage battery via the voltage sensor.

In accordance with one embodiment of the method according to the invention, the electrical pulses can comprise current pulses, voltage pulses or power pulses.

In accordance with a further embodiment of the method according to the invention, the method can furthermore comprise the step of synchronizing the generation of the electrical pulses by means of the DC-DC converter with the detection of the operational parameters of the low-voltage battery by means of the battery sensor circuit with the aid of a grid management device.

BRIEF DESCRIPTION OF THE DRAWINGS

Further features and advantages of embodiments of the invention can be gleaned from the description below with reference to the attached drawings.

DETAILED DESCRIPTION

High-voltage networks within the meaning of the present invention can be network segments in which there is a high rated voltage in comparison with an electrical distribution system voltage. In particular, high-voltage networks can have a high voltage of more than 100 volts. For electrical drive systems comprising mild hybridization, the high voltage can also be less than 100 volts, in particular less than 60 volts, for example 42 or 48 volts. In these high-voltage networks, a lower level of complexity for safeguarding the system with respect to accidental touching contact by users of the hybrid vehicle is necessary.

In contrast low-voltage networks within the meaning of the present invention can have, for example, electrical distribution networks of electrically operated vehicles which are operated in a lower voltage range than the high-voltage networks, for example 12 volts or 14 volts.

Figure 1:
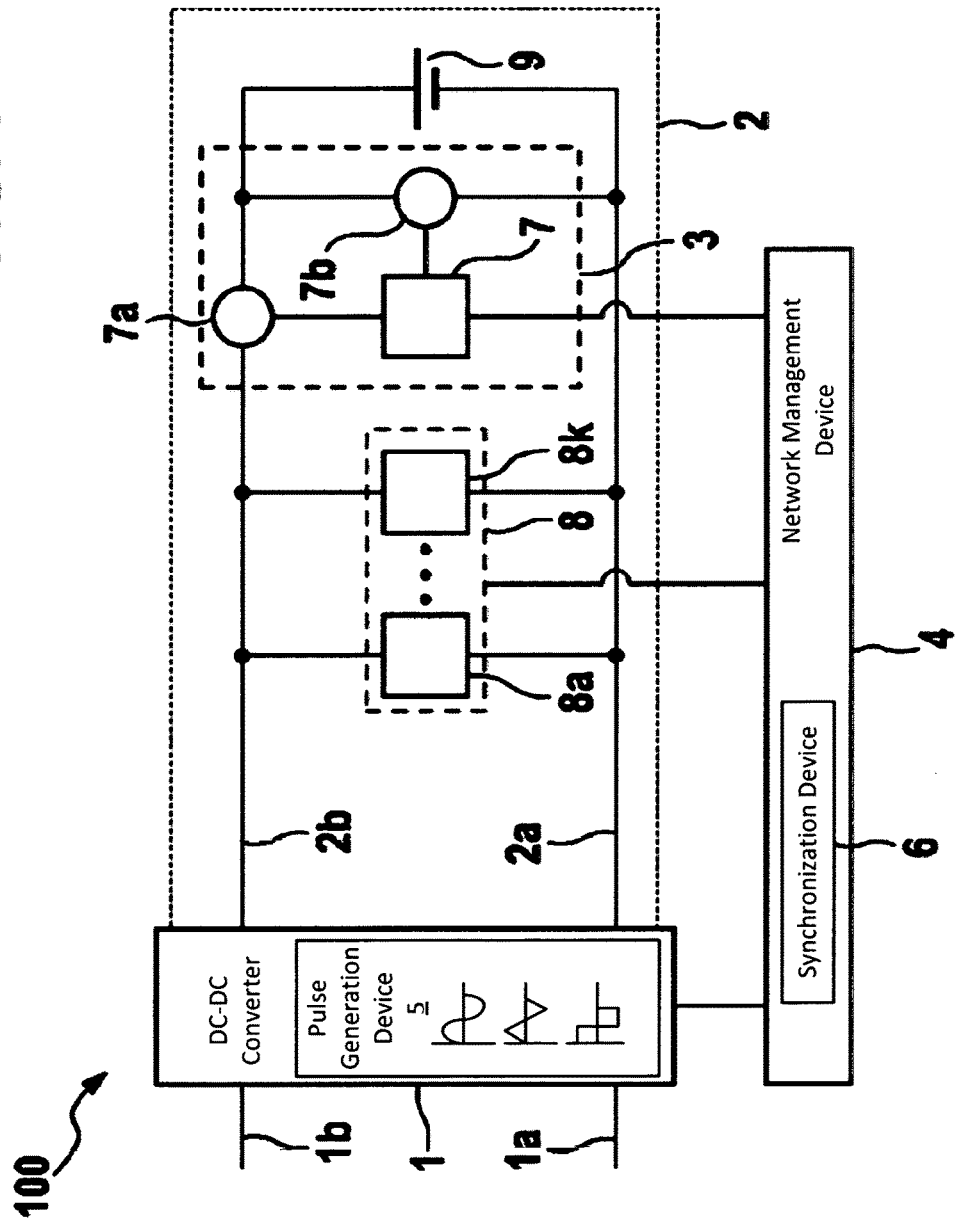
FIG. 1 shows a schematic illustration of a low-voltage network comprising a DC-DC converter in accordance with one embodiment of the present invention.

FIG. 1 shows a system 100, which has a DC-DC converter 1. The DC-DC converter 1 is coupled at the output side to a low-voltage network 2 via output connections 2a, 2b. The low-voltage network 2 can be operated, for example, on an operating voltage of 14 volts. The DC-DC converter 1 can supply a high voltage to the low-voltage network 2, for example from a high-voltage network, which can be coupled to input connections 1a, 1b of the DC-DC converter 1. The high-voltage network can have, for example, an electrical drive, for example a unit comprising an inverter and an electrical machine, which are connected in series. The electrical machine can comprise, for example, an electrically excited synchronous machine, for example a claw pole machine. However, it may also be possible for other electrical machines such as, for example, brushless DC motors or reluctance machines to be used in the electrical drive. For example, the high-voltage network can also be fed by a fuel cell.

The low-voltage network 2 comprises, for example, a low-voltage battery 9, for example a 14 volt lead-acid battery, low-voltage consumers 8, such as, for example, vehicle electronics 8a, a radio 8k or the like, and a battery sensor circuit 3. The number of low-voltage consumers 8 is represented as being two in FIG. 1, but any other number is likewise possible. In addition, the low-voltage consumers 8 can also be connected or disconnected into or from the low-voltage network 2 selectively. The low-voltage consumers 8 therefore represent load-variable power consumers of the low-voltage network 2.

The DC-DC converter 1 can be configured to supply a low voltage, for example 14 volts, to the low-voltage network 2. For this purpose, a setpoint voltage can be preset to the DC-DC converter 1, which adjusts said setpoint voltage. The current on the low-voltage side in this case results from the instantaneous load on the low-voltage network 2, i.e. from the number and the operating state of the connected low-voltage consumers 8 and the state of charge of the low-voltage battery 9.

The low-voltage battery 9 is used, in the normal operating state, for temporarily buffer-storing sudden load changes, for example as a result of a variation in the load consumption of the low-voltage consumers 8 or as a result of connection or disconnection of single or a plurality of low-voltage consumers 8. The battery sensor circuit 3 is used for detecting operational parameters of the low-voltage battery 9 in order to identify defects, malfunctions and/or failures of the low-voltage battery 9. For this purpose, the battery sensor circuit 3 can comprise a detection device 7, which is configured to detect the current from the low-voltage battery 9 or into the low-voltage battery 9 via a current sensor 7a and/or the voltage drop across the low-voltage battery 9 via a voltage sensor 7b. The current sensor 7a may comprise a shunt, for example. Furthermore, the battery sensor circuit 3 can also determine the temperature, the state of charge and/or the performance of the low-voltage battery 9. The detected operational parameters can be transmitted to a network management device 4 via a communications link, for example a CAN bus or an LIN bus, which network management device can actuate the low-voltage consumers 8 and/or the DC-DC converter 1 depending on the operating state of the low-voltage battery 9.

For a precise determination of individual operational parameters, for example the internal resistance of the low-voltage battery 9, it may be necessary to dynamically excite the low-voltage battery 9. With a constant load consumption in the low-voltage network 2 or in open-circuit phases, however, only tracking of the operational parameters is possible. Only when the low-voltage battery 9 is subjected to a load, for example as a result of a change in load in the low-voltage network 2, can the battery sensor circuit 3 determine defects or anomalies in the detected operational parameters.

In order to identify defects, malfunctions or failures of the low-voltage battery 9 early and reliably, the DC-DC converter 1 can be used to generate characteristic electrical pulses in a targeted manner, which are fed into the low-voltage network. With the aid of these characteristic pulses, the low-voltage battery 9 can be dynamically excited and the battery sensor circuit 3 can be enabled to detect operational parameters of the low-voltage battery 9 exactly and independently of the present load consumption in the low-voltage network 2. The characteristic pulses can have current pulses, voltage pulses or power pulses, for example. The characteristic pulses can have, for example, a square-wave waveform, a saw-tooth waveform, a sinusoidal waveform or similar suitable signal waveforms. The number of successive characteristic pulses can be varied, for example a plurality of characteristic pulses can be generated in a predetermined sequence so that disturbances by low-voltage consumers 8 which are connected or disconnected in an uncoordinated or unpredictable manner can be eliminated. For this purpose, the plurality of characteristic pulses can be used for averaging the detected operational parameters in the battery sensor circuit 3. If the characteristic pulses have voltage pulses, said pulses can be superimposed on the setpoint value for the output voltage regulation of the DC-DC converter 1 in a suitable manner.

For the generation of the characteristic electrical pulses, the DC-DC converter 1 can have a pulse generation device 5, which feeds such characteristic electrical pulses into the low-voltage network 2 as required or in periodic intervals. The DC-DC converter 1, and in this case in particular the pulse generation device 5, can be connected to the network management device 4, for example via a communications interface, for example a CAN bus or an LIN bus, and can transmit parameters relating to the characteristic electrical pulses to the network management device 4. The network management device 4 can correlate or synchronize the generated characteristic electrical pulses with the detected operational parameters in the battery sensor circuit 3 with the aid of a synchronization device 6 contained in the network management device 4.

Figure 2:
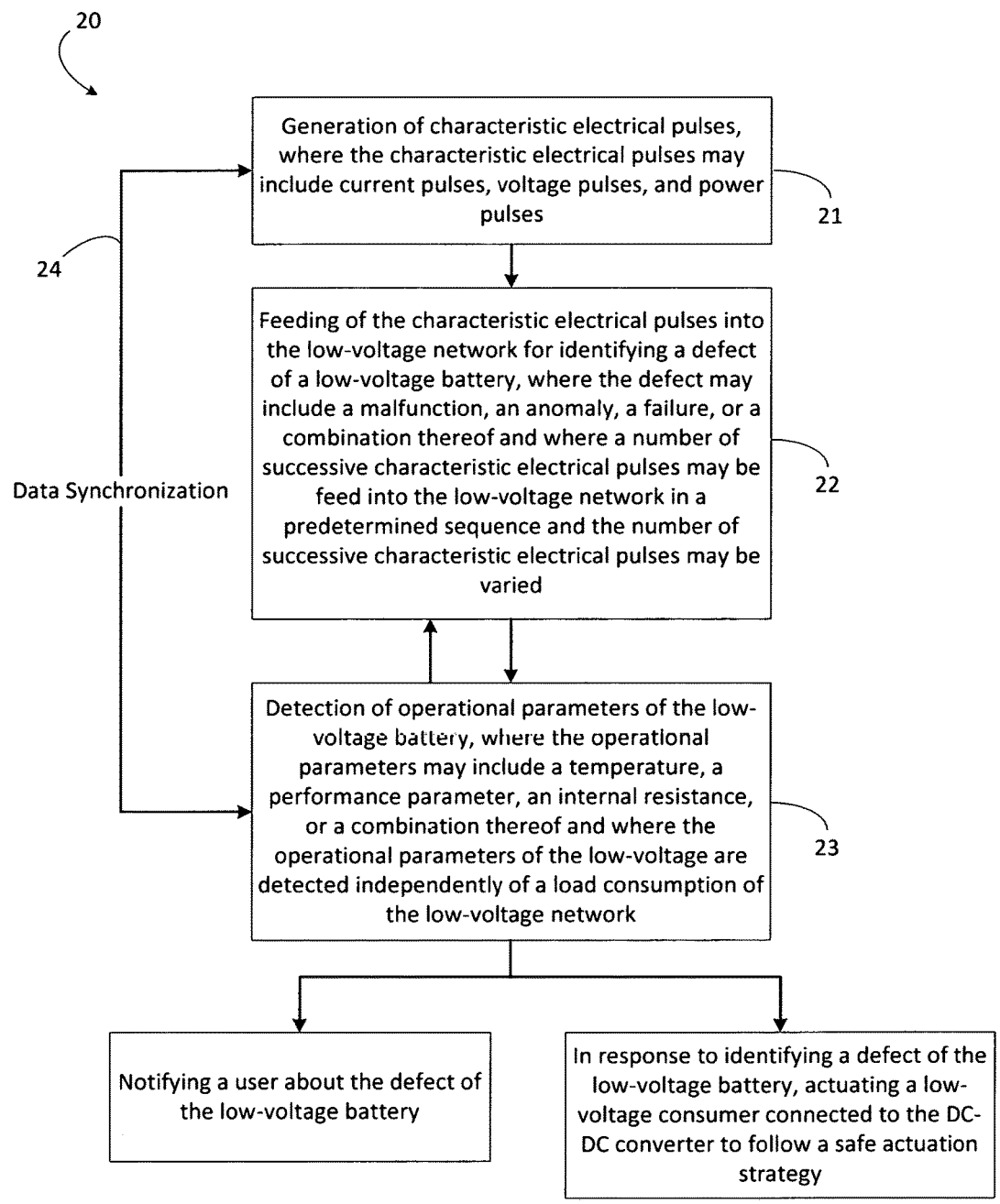
FIG. 2 shows a schematic illustration of a method for testing a low-voltage battery in accordance with a further embodiment of the present invention.

FIG. 2 shows a schematic illustration of an exemplary method 20 for testing a low-voltage battery, in particular a low-voltage battery 9 in the low-voltage network 2 explained in connection with FIG. 1. The method 20 can be implemented, for example, with the aid of the DC-DC converter 1, the network management device 4 and the battery sensor 3.

In a first step 21, generation of characteristic electrical pulses, for example current pulses, voltage pulses or power pulses, takes place by means of a DC-DC converter 1, which is configured to supply a low voltage to a low-voltage network 2 comprising a low-voltage battery 9 and a battery sensor circuit 3. For example, the low-voltage battery can comprise a 12 or 14 volt battery. The low-voltage network 2 can conduct a low voltage of 14 volts, for example. In a second step 22, feeding of the characteristic electrical pulses into the low-voltage network 2 takes place, whereafter, in a step 23, detection of operational parameters of the low-voltage battery 9 by means of the battery sensor circuit 3 depending on the electrical pulses takes place.

In this case, provision can be made for the generation of the electrical pulses by means of the DC-DC converter 1 to be synchronized with the detection 23 of the operational parameters of the low-voltage battery 9 by means of the battery sensor circuit 3, for example with the aid of a network management device 4, as is indicated schematically in FIG. 2 by means of the dashed line identified by the reference symbol 24.

By virtue of the method 20, defects, malfunctions or failures of the low-voltage battery 9 can be identified quickly and reliably so that the energy management can be switched over to a corresponding supply strategy in good time. For example, safe actuation strategies can be followed for the low-voltage consumers 8: off-regulation of non-safety-relevant low-voltage consumers, gradient-limited on-regulation of high-load consumers, matching of high-load consumers, avoidance of sudden changes in load or the like. By virtue of these measures, a collapse of the low-voltage in the low-voltage network 2 can be avoided owing to the lack of buffer effect of the low-voltage battery 9. Furthermore, in the case of electrically operated vehicles, for example, the user of the vehicle can be made aware of the defect or the malfunction so that operation under emergency conditions remains ensured.

The invention claimed is:

1. A DC-DC converter, which is configured to supply a low voltage to a low-voltage network that includes a low-voltage battery and a battery sensor circuit, the DC-DC converter comprising:
   a pulse generation device, which is configured to
      feed characteristic electrical pulses in a targeted manner for identifying a defect of the low-voltage battery through the battery sensor circuit into the low-voltage network, wherein the characteristic electrical pulses are at least one selected from a group consisting of a square-wave waveform, a saw-tooth waveform, and a sinusoidal waveform, and
      transmit parameters relating to the characteristic electrical pulses to a network management device via a communications interface, wherein the network management device includes a synchronization device configured to synchronize the generation of the characteristic electrical pulses with the detection of operational parameters of the low-voltage battery using the parameters transmitted from the pulse generation device, wherein the generation of the characteristic electrical pulses occurs at the same time as the detection of operational parameters of the low-voltage battery,
   wherein a low-voltage consumer connected to the DC-DC converter is actuated to follow a safe actuation strategy in response to identifying a defect of the low-voltage battery, and
   wherein the DC-DC converter couples a high-voltage network of an electrical drive or generator system to the low-voltage network and supplies electrical energy to the low-voltage network from the high-voltage network.

2. The DC-DC converter as claimed in claim 1, wherein the pulse generation device is configured to generate at least one of a group consisting of current pulses, voltage pulses, and power pulses.

3. The DC-DC converter as claimed in claim 1, wherein the characteristic electrical pulses dynamically excite the low-voltage battery.

4. The DC-DC converter as claimed in claim 1, wherein the defect of the low-voltage battery includes at least one selected from a group consisting of a malfunction of the low-voltage battery, an anomaly of the low-voltage battery, and a failure of the low-voltage battery.

5. The DC-DC converter as claimed in claim 1, wherein the pulse generation device is configured to feed a multiplicity of characteristic electrical pulses in a predetermined sequence into the low-voltage network.

6. The DC-DC converter of claim 5, wherein a number of successive characteristic pulses included in the predetermined sequence of the multiplicity of characteristic electrical pulses is varied to eliminate disturbances in the low-voltage consumer.

7. A low-voltage network, comprising:
   a DC-DC converter as claimed in claim 1;
   a low-voltage battery; and
   a battery sensor circuit, which is configured to detect operational parameters of the low-voltage battery depending on the characteristic electrical pulses generated by the DC-DC converter and identify a defect of the low-voltage battery based on the operational parameters.

8. The low-voltage network as claimed in claim 7, wherein the battery sensor circuit has a detection device, a current sensor and a voltage sensor, and wherein the detection device is configured to detect the current from the low-voltage battery or into the low-voltage battery via the current sensor and to detect the voltage drop across the low-voltage battery via the voltage sensor.

9. The low-voltage network as claimed in claim 7, wherein the operational parameter of the low-voltage battery includes at least one selected from a group consisting of a temperature of the low-voltage battery, a performance parameter of the low-voltage battery, and an internal resistance of the low-voltage battery.

10. The low-voltage network as claimed in claim 7, wherein the battery sensor circuit detects the operational parameters of the low-voltage battery independently of a load consumption of the low-voltage network.

11. A method for testing a low-voltage battery, the method comprising:
   generating characteristic electrical pulses in a targeted manner by means of a DC-DC converter, which is configured to supply a low voltage to a low-voltage network that includes a low-voltage battery and a battery sensor circuit;
   feeding the characteristic electrical pulses into the low-voltage network, wherein the characteristic electrical pulses are at least one selected from a group consisting of a square-wave waveform, a saw-tooth waveform, and a sinusoidal waveform;
   transmitting parameters relating to the characteristic electrical pulses to a network management device via a communications interface;
   detecting operational parameters of the low-voltage battery by means of the battery sensor circuit depending on the characteristic electrical pulses, wherein the detection of the operational parameters of the low-voltage battery is synchronized with the generation of the characteristic electrical pulses using the parameters transmitted to the network management device, wherein the generation of the characteristic electrical pulses occurs at the same time as the detection of operational parameters of the low-voltage battery;
   identifying a defect of the low-voltage battery based on the operational parameters; and
   in response to identifying a defect of the low-voltage battery, actuating a low-voltage consumer to follow a safe actuation strategy based on the detected operational parameters,
   wherein the DC-DC converter couples a high-voltage network of an electrical drive or generator system to the low-voltage network and supplies electrical energy to the low-voltage network from the high-voltage network.

12. The method as claimed in claim 11, wherein the characteristic electrical pulses include at least one of a group consisting of current pulses, voltage pulses, and power pulses.

13. The method as claimed in claim 11, further comprising:
   transmitting the operational parameters of the low-voltage battery from the battery sensor circuit to the network management device via the communications link; and
   actuating, with the network management device, the DC-DC converter based on the operational parameters of the low-voltage battery.

14. The method as claimed in claim 11, further comprising:
   notifying a user about the defect of the low-voltage battery.

* * * * *